United States Patent [19]

Merrill et al.

[11] Patent Number: 5,276,350
[45] Date of Patent: Jan. 4, 1994

[54] LOW REVERSE JUNCTION BREAKDOWN VOLTAGE ZENER DIODE FOR ELECTROSTATIC DISCHARGE PROTECTION OF INTEGRATED CIRCUITS

[75] Inventors: Richard B. Merrill, Daly City; Kai Chen, Sunnyvale, both of Calif.

[73] Assignee: National Semiconductor Corporation, Santa Clara, Calif.

[21] Appl. No.: 899,833

[22] Filed: Jun. 16, 1992

Related U.S. Application Data

[63] Continuation of Ser. No. 652,154, Feb. 7, 1991, abandoned.

[51] Int. Cl.$^5$ .............. H01L 29/90; H01L 29/88; H01L 23/62; H01L 31/107
[52] U.S. Cl. .............. 257/603; 257/106; 257/355; 257/604; 257/605
[58] Field of Search .............. 357/13, 23.13; 257/355, 257/603, 604, 605, 606, 106

[56] References Cited

U.S. PATENT DOCUMENTS

| | | |
|---|---|---|
| 4,064,525 | 12/1977 | Kano et al. ............... 357/13 |
| 4,079,402 | 3/1978 | Dunkley et al. ........... 357/13 |
| 4,224,631 | 9/1980 | Vickery et al. ............ 357/13 |
| 4,757,363 | 7/1988 | Bohm et al. ............ 357/23.13 |
| 4,872,039 | 10/1989 | Stabile .................. 357/13 |
| 4,984,031 | 1/1991 | Rinderle ................ 357/13 |
| 4,999,683 | 3/1991 | Kiyomura et al. ......... 357/13 |
| 5,021,840 | 6/1991 | Morris .................. 357/13 |
| 5,027,181 | 6/1991 | Larik et al. ............ 357/13 |

FOREIGN PATENT DOCUMENTS

| | | | |
|---|---|---|---|
| 56-1575 | 1/1981 | Japan ............... 357/13 |
| 56-137673 | 10/1981 | Japan ........... 357/23.13 |
| 57-169273 | 10/1982 | Japan ............... 357/13 |
| 58-48471 | 3/1983 | Japan ............... 357/13 |
| 61-64152 | 4/1986 | Japan ........... 357/23.13 |
| 61-255055 | 11/1986 | Japan ........... 357/23.13 |
| 63-77155 | 4/1988 | Japan ........... 357/23.13 |
| 2-137269 | 5/1990 | Japan ........... 357/23.13 |
| 2-187071 | 7/1990 | Japan ............... 357/13 |
| 2-297966 | 12/1990 | Japan ........... 357/23.13 |
| 3-9559 | 1/1991 | Japan ........... 357/23.13 |
| WO89/05041 | 6/1989 | PCT Int'l Appl. ....... 357/13 |

OTHER PUBLICATIONS

Semiconductor Devices—Physics and Technology, 1985 by S. M. Sze, p. 38, FIG. 7.

Primary Examiner—Rolf Hille
Assistant Examiner—Steven Loke
Attorney, Agent, or Firm—Townsend and Townsend Khourie and Crew

[57] ABSTRACT

A zener diode with a low reverse breakdown avalanche voltage and the use of zener diode in electrostatic discharge protection circuit is described herein. The low breakdown avalanche voltage is achieved by creating a zener diode with a lightly doped region between the P+ and N+ zones. Zener diode disclosed herein is particularly useful in protection circuits for integrated circuits having features or sizes of one micron or less.

10 Claims, 1 Drawing Sheet

LOW REVERSE JUNCTION BREAKDOWN VOLTAGE ZENER DIODE FOR ELECTROSTATIC DISCHARGE PROTECTION OF INTEGRATED CIRCUITS

This is a continuation of application Ser. No. 07/652,154 filed Feb. 7, 1991, now abandoned.

BACKGROUND OF THE INVENTION

1. Field of the Invention

This invention relates to electrostatic discharge protection circuits. More particularly, the invention relates to electrostatic discharge protection circuits used to protect field effect transistor integrated circuits, especially those with features of one micron or smaller.

2. Description of the Prior Art

Integrated circuits employing field effect devices, commonly termed MOS integrated circuits, are susceptible to electrostatic discharge. Given the decreasing size of circuit features resulting from improving process technology, static electricity generated by daily activity alone can destroy or substantially harm many MOS circuits. The circuits most susceptible to damage are usually finished circuits which have been packaged, but not yet installed in a finished product. Once installed, other means can protect the chip from damage.

An electrostatic discharge typically occurs when the circuit is touched by an individual handling the circuit before installation; when a static discharge occurs as the packaged circuit slides on its pins across another surface; or more generally, whenever the circuit is exposed to static electricity. Overall, damage from electrostatic discharges is the cause of over half of the devices returned by customers.

One traditional method for protecting integrated circuit devices comprised of field effect transistors from electrostatic discharge is to use diodes. These diodes are coupled between the input paths of the circuit and the pins to which the power supplies are connected. With electrostatic discharge events of one polarity the diodes are forward-biased, and with discharges of the opposite polarity they are reverse-biased. Normally the discharge that causes the diodes to become reverse-biased is the more problematic, because voltages and power surges seen by the internal logic circuits are higher than for the forward-biased case. Other methods used for protecting MOS circuits from electrostatic discharge are almost always variations on the diode clamping system described above.

The traditional methods described above usually function satisfactorily for circuits with large features. However, as the features of integrated circuits approach one micron and less, lower voltages than those which damage larger features can destroy the diodes and the circuit. The reverse junction breakdown voltage of known diodes is too high to protect these new integrated circuits.

SUMMARY OF THE INVENTION

The present invention comprises a method for creating diodes with a low reverse junction avalanche breakdown voltage and the diodes and circuits made possible by this method.

The known method of creating a diode, implanting N+ and P+ dopants into adjacent areas in either an N or P well, thereby creating a P+/N+ device, is modified by the present invention. Herein, in an area between the N+ and P+ zones, a Lightly Doped Region ('LDR') implant is performed. The resultant diode, comprised of a P+/LDR/N+ structure, has a reverse junction avalanche breakdown voltage of approximately 6.6 volts, much lower than known diodes. As noted, this diode structure can be set in either a P or an N well.

The diodes created by the method of the present invention can be used in known electrostatic discharge protection circuits or in new circuits made possible by the new diodes.

The present invention will now be described in detail, with reference to the figures described below.

DETAILED DESCRIPTION OF THE EMBODIMENT(S)

Figure 1:
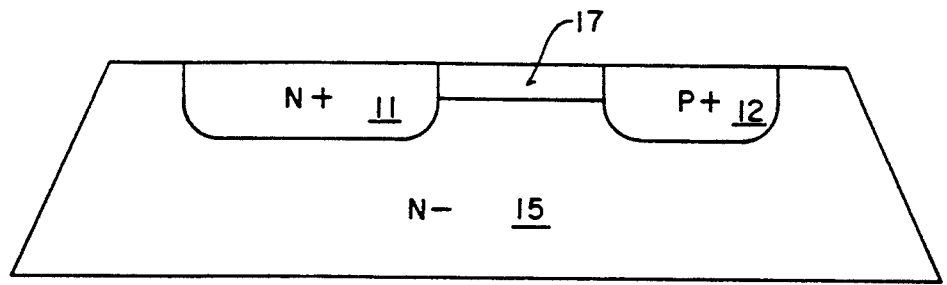
FIG. 1 is a cross-section of a diode created by the method of the present invention.

The traditional known CMOS electrostatic discharge protection network makes use of a diode's reverse junction avalanche breakdown voltage to protect the gate oxides of the input/output transistors. As the feature sizes of integrated circuits have shrunk, the oxide breakdown voltage has also decreased, to the point where the known diodes have a breakdown voltage approximately equal to the gate oxide breakdown voltage. In the case where features are roughly 1 micron in size, the reverse avalanche breakdown voltage of the protection network's diodes is roughly 15 volts. The situation will only worsen when 0.8 micron features become the standard, as the diodes' breakdown voltage will still be roughly 15 volts and the oxide breakdown will be roughly 10 volts.

The present invention solves this problem using, in one embodiment, a known electrostatic discharge protection network with special low reverse junction avalanche breakdown voltage zener diodes. Whereas known diodes have a breakdown voltage of about 15 volts, these special zener diodes have a breakdown voltage of roughly 6.6 volts.

FIG. 1 illustrates how these special diodes are fabricated. Using known CMOS fabrication techniques, an N+ cathode region 11 and a P+ anode region 12 are created on a N− or P− semiconductor substrate 15. In a preferred embodiment, the N+ region is doped with a concentration of arsenic ions until the concentration is approximately $10^{20}$ atoms/cm$^3$ P+ region has an approximate $10^{20}$ atoms/cm$^3$ concentration of boron.

Between the N+ and P+ regions, an LDR implant 17 is then created. Although LDR implants are known and used in sub-micron transistors, where the LDR implant alleviates the hot electron problem, there has never been any indication that such an implant could have any use in the fabrication of an electrostatic discharge protection circuit. However, by using an LDR implant as part of the diode fabrication process, a zener diode with a breakdown voltage of 6.6 volts is created. The LDR uses phosphorous as its preferred dopant, and the preferred concentration of the phosphorous is approximately $10^{17}$ atoms/cm$^3$. As the avalanche breakdown voltage is proportional to the log of the LDR concentration, the exact size of the LDR implant and precise concentration of the dopant are not critical. As a fair amount of variablility is therefore acceptable in the manufacturing of this type of diode, the cost of creating these diodes is not much, if any, greater than the cost of creating conventional diodes.

Figure 2A:
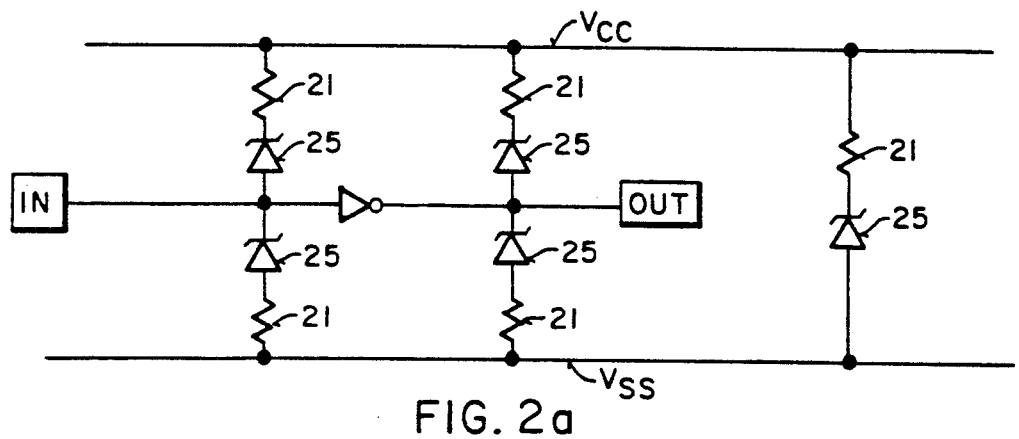
FIG. 2a and 2b show the diodes of the present invention used in an electrostatic discharge protection circuit and the path of discharge currents in the circuit.
Figure 2B:
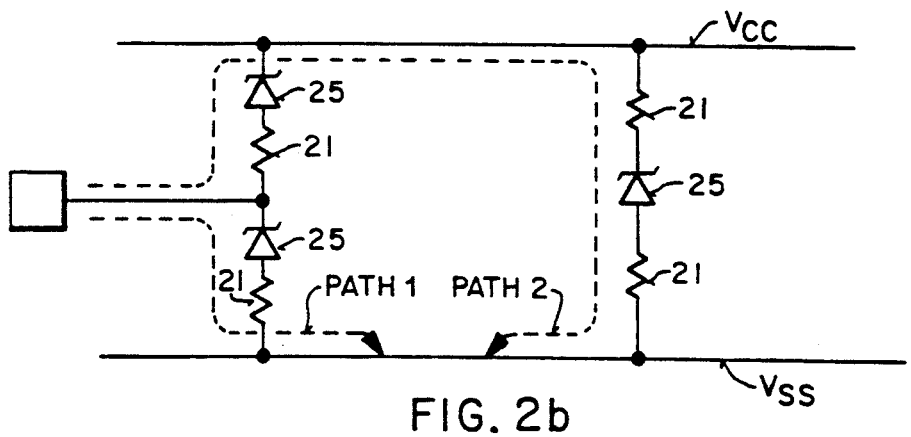
Figure 3:
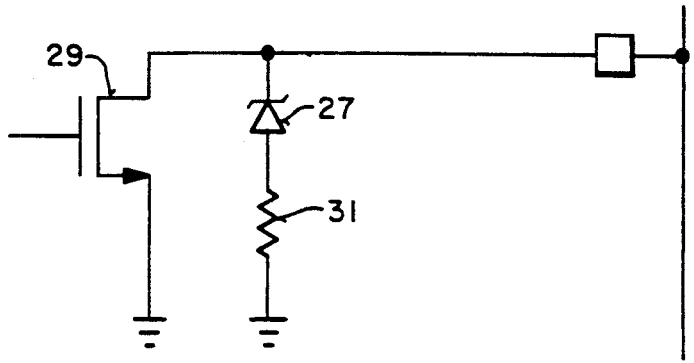
FIG. 3 shows a second embodiment of the present invention.

FIG. 2A and 2B show a known electrostatic protection system provided with zener diodes 25 created by the method disclosed herein. The discharge path which occurs after the application of an electrostatic discharge event is indicated by an arrow. Resistors 21 must be kept sufficiently small so that the sum of the voltage drops across all elements in the discharge's path remains less than the gate oxide breakdown voltage. As the value of resistors 21 is proportional to the inverse of the area, the resistors must have as much area as possible to insure a low resistance. As chip area is extremely valuable, however, the area that can be devoted to resistors 21 is relatively constrained. FIG. 3 is a circuit diagram of another embodiment of the present invention which utilizes the unique properties of the zener diode created by the process described herein. As shown, the entire electrostatic protection network comprises a single zener diode 27 and the parasitic resistance 31 created therewith coupled between the source of input transistor 29 and ground. The breakdown voltage of known diodes is too great to allow use of this circuit for protection of the illustrated open drain circuit The squares in FIGS. 2A, 2B and 3 represent pins by which static electricity may be applied to the electrostatic protection circuit.

The present invention has now been described in several of its embodiments. Variations in the process to create the present invention as well as variations in the electrostatic discharge circuits created with the present invention are readily foreseeable and within the scope of this disclosure. Consequently, this specification and the claims should be read in a broad, inclusive sense.

What is claimed is:

1. A zener diode created on a portion of an N type semiconductor substrate having a first dopant concentration, said substrate having a top surface, the diode comprising:

a first N type region having a second dopant concentration implanted in the semiconductor substrate, the second dopant concentration being greater than the first dopant concentration, the first region having a first surface generally coplanar with said top surface;

a P type region implanted in the semiconductor substrate, the first n type region and the p type region being spaced apart from one another, the p type region having a second surface generally coplanar with said top surface; and a second N type region, implanted in the semiconductor substrate between the first n type region and the p type region, abutting both the first n type region and the p type region and having a third surface generally coplanar with said top surface, the second n type region having a dopant concentration greater than the first dopant concentration but less than the second dopant concentration.

2. The zener diode of claim 1 wherein the dopant for the second n type region comprises phosphorous.

3. The zener diode of claim 2 wherein the phosphorous concentration is approximately $10^{17}$ atoms/cm$^3$.

4. The zener diode of claim 1 wherein the zener diode has a breakdown voltage of 6.6 volts.

5. An electrostatic discharge protection circuit coupled to the source of an input transistor, the circuit comprising:

a zener diode having an avalanche breakdown voltage of 6.6 volts, the cathode of the zener diode being coupled to the source of the input transistor;

said zener diode comprises a P+ region with a first dopant concentration and an N+ region with a second dopant concentration formed on an N type substrate having a third dopant concentration, the P+ region and the N+ region being separated by an N type lightly doped region having a fourth dopant concentration less than the first and second dopant concentrations but greater than the third dopant concentration; and resistor means coupled to the anode of the zener diode and to a ground voltage potential.

6. The zener diode of claim 5 wherein the substrate has a top surface, the P+ region has a first surface, the N+ region has a second surface, and the n type lightly doped region has a third surface, said top surface and said first, second and third surfaces being generally coplanar.

7. A zener diode created on a portion of a semiconductor substrate with a first conductivity type and a first dopant concentration and having a top surface, the diode comprising:

a first region having the first conductivity type and a second dopant concentration implanted in the semiconductor substrate, the second dopant concentration being greater than the first dopant concentration, the first region having a first surface generally coplanar with the top surface;

a second region having a second conductivity type implanted in the semiconductor substrate, the first and second regions being spaced apart from one another, the second region having a second surface generally coplanar with the top surface; and a third region implanted in the semiconductor substrate between the first and second regions, the third region abutting both the first and second regions and having a third surface generally coplanar with said top surface, wherein the third region has the first conductivity type and a dopant concentration greater than the first dopant concentration but less than the second dopant concentration.

8. The zener diode of claim 7 wherein the zener diode has a breakdown voltage of 6.6 volts.

9. The zener diode of claim 7 wherein the first conductivity type is N-type and the second conductivity type is P-type.

10. The zener diode of claim 7 wherein the dopant concentration of said third region is about $10^{17}$ atoms/cm$^3$.

* * * * *